(12) United States Patent
Kim et al.

(10) Patent No.: US 7,732,315 B2
(45) Date of Patent: Jun. 8, 2010

(54) METHODS OF FABRICATING SEMICONDUCTOR DEVICES AND STRUCTURES THEREOF

(75) Inventors: Sun-Oo Kim, Hopewell Junction, NY (US); Yoon-Hae Kim, Gyeonggi (KR)

(73) Assignees: Infineon Technologies AG, Neubiberg (DE); Samsung Electronics Co., Ltd., Suwon-Si, Gyeonggi-Do (KR)

( * ) Notice: Subject to any disclaimer, the term of this patent is extended or adjusted under 35 U.S.C. 154(b) by 339 days.

(21) Appl. No.: 11/849,535

(22) Filed: Sep. 4, 2007

(65) Prior Publication Data

US 2009/0057923 A1    Mar. 5, 2009

(51) Int. Cl.
*H01L 21/00* (2006.01)

(52) U.S. Cl. ...................................... 438/584

(58) Field of Classification Search ........................ None
See application file for complete search history.

(56) References Cited

U.S. PATENT DOCUMENTS

| 5,003,365 A * | 3/1991 | Havemann et al. .......... 257/514 |
| 2002/0192911 A1 * | 12/2002 | Parke .......................... 438/270 |

* cited by examiner

*Primary Examiner*—Scott B Geyer
(74) *Attorney, Agent, or Firm*—Slater & Matsil, L.L.P.

(57) ABSTRACT

Methods of fabricating semiconductor devices and structures thereof are disclosed. In a preferred embodiment, a method of manufacturing a semiconductor device includes providing a semiconductor wafer, forming a first insulating material over the semiconductor wafer, and forming a plurality of first features and a plurality of second features in the first insulating material. The plurality of first features is removed, leaving an unfilled pattern in the first insulating material. The unfilled pattern in the first insulating material is filled with a second insulating material.

25 Claims, 7 Drawing Sheets

METHODS OF FABRICATING SEMICONDUCTOR DEVICES AND STRUCTURES THEREOF

TECHNICAL FIELD

The present invention relates generally to the fabrication of semiconductor devices, and more particularly to the fabrication of conductive layers of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography and etch processes to form circuit components and elements thereon.

Chemical-mechanical polishing (CMP) processes are often used to planarize material layers of semiconductor devices. In many integrated circuit designs, material layers are planarized before depositing subsequent material layers. CMP processes are typically used for global planarization of a semiconductor wafer, and to remove excess material from over certain topographical features, e.g., after an etch process or deposition process, for example. In a CMP process, elevated features of a wafer are selectively removed, e.g., material from high elevation features is removed more rapidly than material at lower elevations, resulting in reduced topography. The process is referred to as "chemical-mechanical polishing" because material is removed from the wafer by mechanical polishing, assisted by chemical action.

It is important for etch processes and CMP processes to have a uniform effect on semiconductor devices during the fabrication process in some designs, so that the various devices formed thereon have uniform electrical parameters. A planar surface is also important in order to achieve depth of focus (DOF) for lithography processes, for example.

Some semiconductor device designs have regions that are densely populated with features and other regions that are absent features or are less densely populated with features. A CMP process may affect the more densely populated regions differently than the less densely populated regions, resulting in an uneven planarization process. For example, less densely populated regions may be planarized more than more densely populated regions. Dishing of material layers may also occur in less densely populated regions, as another example. Uneven planarization and dishing may present problems later in the manufacturing process as subsequent material layers are deposited and processed over the wafer.

Thus, what are needed in the art are improved methods of fabricating semiconductor devices and structures thereof.

SUMMARY OF THE INVENTION

These and other problems are generally solved or circumvented, and technical advantages are generally achieved, by preferred embodiments of the present invention, which provide novel methods of manufacturing semiconductor devices and structures thereof.

In accordance with a preferred embodiment of the present invention, a method of manufacturing a semiconductor device includes providing a semiconductor wafer, forming a first insulating material over the semiconductor wafer, and forming a plurality of first features and a plurality of second features in the first insulating material. The plurality of first features is removed, leaving an unfilled pattern in the first insulating material. The unfilled pattern in the first insulating material is filled with a second insulating material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
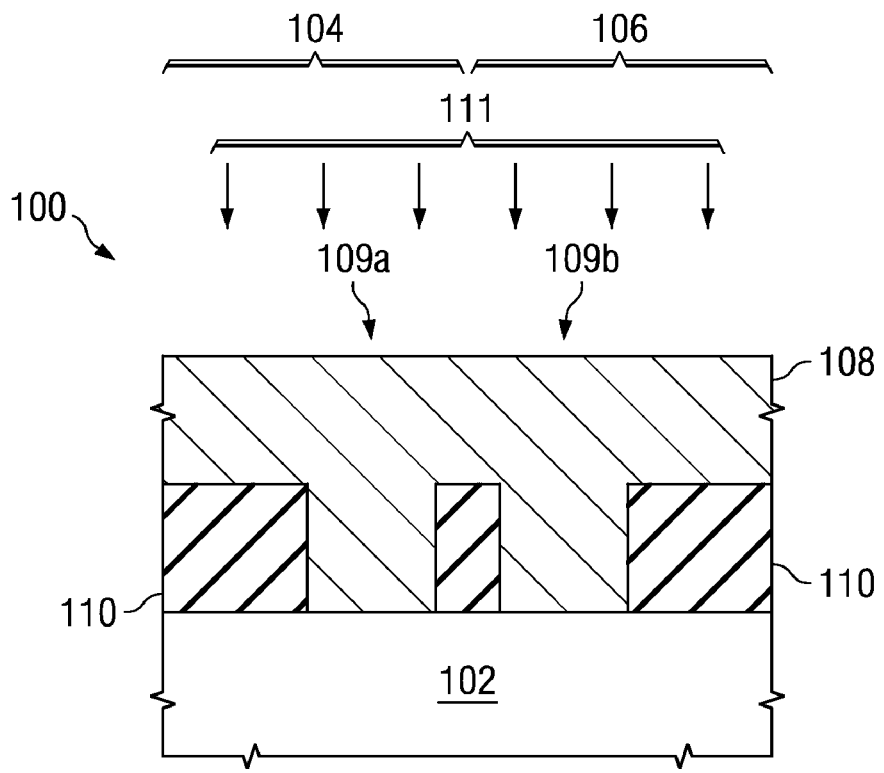
FIGS. 1 through 4 show cross-sectional views of a semiconductor device at various stages of manufacturing in accordance with a preferred embodiment of the present invention, wherein first and second features are formed, and the first features are removed and filled with an insulating material.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in specific contexts, namely implemented in passive semiconductor device applications wherein conductive features are formed using damascene processes. Embodiments of the invention may also be implemented in other semiconductor applications such as memory devices, logic devices, and other applications that utilize conductive features, or applications wherein improvement of the planarization of CMP processes is desired, for example.

A CMP process may affect densely populated regions of a material layer differently than less densely populated regions, resulting in an uneven planarization process and dishing. This is undesirable, because subsequent layers formed on the material layer may not be planar, degrading the DOF of lithography processes and/or the thickness of a subsequently deposited layer. For example, an insulating layer that conductive vias or lines may be formed in may be thicker over dished areas than in other areas, and thus conductive vias or lines in that layer have varying thicknesses, producing a semiconductor device that has unpredictable performance and characteristics.

Dummy conductive features are included in some designs in less densely populated regions of a layout for a conductive material layer in order to improve planarization of CMP processes. For example, dummy conductive features may be included in conductive material layers that are formed using damascene techniques. In a damascene method of forming a conductive material layer, an insulating material layer is patterned, and the patterns are filled in with conductive material. Excess conductive material is then removed from over the top surface of the insulating material layer using a CMP process.

However, dummy conductive features can cause problems in some designs, by deleteriously affecting the performance of a semiconductor device. The additional conductive material can affect capacitance, inductance, and heat dissipation properties of other elements of the semiconductor device proximate the dummy conductive features, as examples. The dummy conductive features may also cause noise, e.g., in certain types of circuits such as in radio frequency (RF) circuits, as an example. Dummy conductive features may cause parasitic capacitance in passive devices such as inductors, for example.

Thus, what are needed in the art are improved methods of manufacturing semiconductor devices that include dummy conductive features, wherein the dummy conductive features do not deleteriously affect semiconductor device performance.

Embodiments of the present invention achieve technical advantages by removing dummy conductive features after CMP processes, and replacing the dummy conductive features with an insulating material.

FIGS. 1 through 4 show cross-sectional views of a semiconductor device 100 at various stages of manufacturing in accordance with a preferred embodiment of the present invention wherein first conductive features, also referred to herein as dummy conductive features or dummy features, in a first region are removed and the patterns are then filled with an insulating material.

To manufacture the semiconductor device 100, referring first to FIG. 1, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a SiGe-on-insulator substrate, as examples.

The workpiece 102 includes at least one first region 104 and at least one second region 106 proximate the at least one first region 104. There may be a plurality of first regions 104 and second regions 106 on the workpiece 102, for example, not shown. The first region 104 comprises a region where dummy features will be formed, and the second region 106 comprises a region where functioning features will be formed, for example.

Conductive features 108a and 108b (see FIG. 2) are then formed in the first region 104 and the second region 106, respectively, within an insulating material 110 disposed over the workpiece 102 using a damascene process. The conductive features 108a and 108b are also referred to herein as a plurality of first features 108a and a plurality of second features 108b, for example. Only one first feature 108a and second feature 108b is shown in FIGS. 1 through 4, although preferably a plurality of first features 108a and a plurality of second features 108b are formed in the first region 104 and second region 106, respectively.

To form the conductive features 108a and 108b, an insulating material 110 is formed over the workpiece 102, as shown in FIG. 1. The insulating material 110 is also referred to herein as a first insulating material or a first insulating material layer, for example. The insulating material 110 preferably comprises an insulator such as borophosphosilicate glass (BPSG), phosphosilicate glass (PSG), boron-doped silicon glass (BSG), organo-silicate glass (OSG), fluorinated silicate glass (FSG), spun-on-glass (SOG), silicon nitride, silicon dioxide, plasma enhanced tetraethyloxysilane (PE-TEOS), or multiple layers or combinations thereof, as examples, although alternatively, the insulating material 110 may comprise other materials. The insulating material 110 may be deposited or formed using chemical vapor deposition (CVD), atomic layer deposition (ALD), metal organic chemical vapor deposition (MOCVD), physical vapor deposition (PVD), jet vapor deposition (JVD), or combinations thereof, as examples, although alternatively, other methods may also be used. The insulating material 110 may comprise a thickness of about 50 nm or greater, for example, although the insulating material 110 may comprise other dimensions. The insulating material 110 may comprise an inter-layer dielectric (ILD) layer, for example. The insulating material 110 may comprise an ILD layer for a conductive line layer or a via layer of the semiconductor device 100, for example.

The insulating material 110 is etched to form patterns 109a and 109b in the first insulating material 110 using lithography. For example, a layer of photosensitive material (not shown) such as a photoresist may be deposited over the insulating material 110, and a lithography process may be used to pattern the layer of photosensitive material. A hard mask may also be used in the lithography process to pattern the first insulating material 110, also not shown. Portions of the insulating material first 110 are etched away using the layer of photosensitive material as a masking material, and then the layer of photosensitive material is removed. Patterns 109a and 109b are formed in the first insulating material 110, as shown. Pattern 109a in the first region 104 is also referred to herein as a first pattern or a first pattern for a plurality of first features, and pattern 109b in the second region 106 is also referred to herein as a second pattern or a second pattern for a plurality of second features, for example.

A conductive material 108 is deposited or formed over the patterned insulating material 110, as shown in FIG. 1. The conductive material 108 may be deposited or formed by sputtering, CVD, ALD, MOCVD, PVD, JVD, or combinations thereof, as examples, although alternatively, other methods may be used. The conductive material 108 may comprise copper, aluminum, titanium, tantalum, other conductive materials or metals, or combinations or multiple layers thereof, as examples. The conductive material 108 may comprise a liner comprised of TaN/Ta followed by the deposition of a copper fill material, for example. The conductive material 108 may also comprise a semiconductive material such as polysilicon, amorphous silicon, other semiconductive materials, combinations or multiple layers thereof, or combinations or multiple layers thereof with one or more metals, for example. The conductive material 108 may also be silicided, before or after a CMP process 111 to remove excess conductive material 108 from over the insulating material 110, for example.

Figure 2:
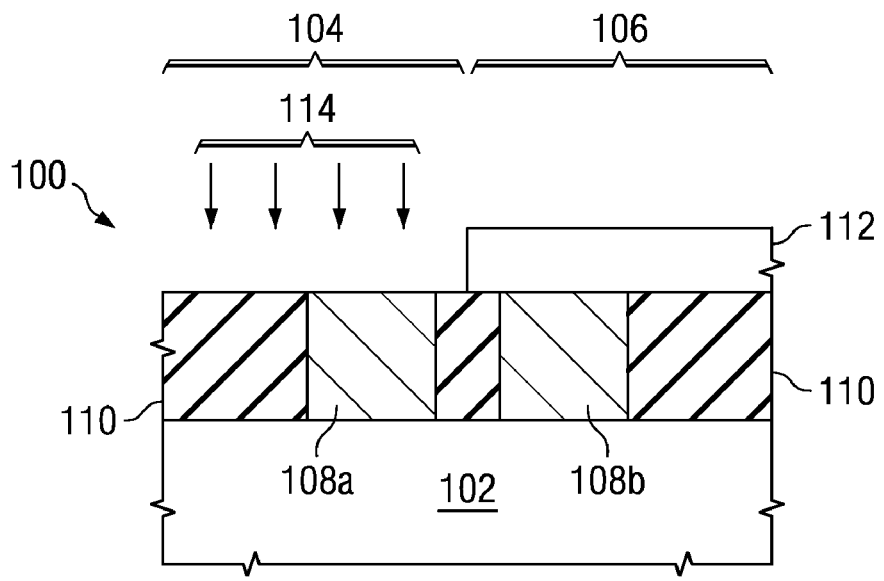

Next, a CMP process 111 is used to remove the excess conductive material 108 from over the insulating material 110, leaving the first features 108a and second features 108b formed in the insulating material 110 in the first region 104 and the second region 106, respectively, as shown in FIG. 2. The first pattern 109a advantageously improves the planarity or the planarization properties of the CMP process 111 due to the presence of the conductive material 108a in the first pattern 109a comprising a first feature or a dummy feature, for example. In some embodiments, the features 108a and 108b preferably comprise a conductive material, a semiconductive material, or combinations thereof, for example.

The second feature 108b may comprise a passive component of the semiconductor device 100 in some embodiments. The second feature 108b may comprise at least a portion of an inductor, a capacitor, an antenna, a conductive line, or a conductive via, in other embodiments, as examples. The second feature 108b preferably comprises a functioning element or at least a portion of a functioning circuit of the semiconductor device 100, for example.

Figure 3:
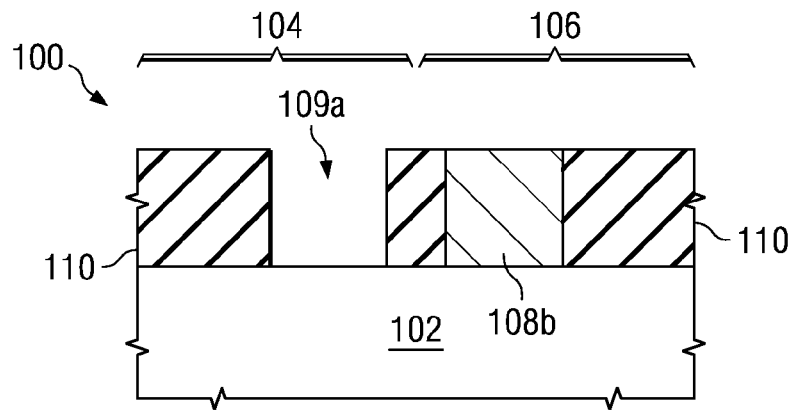

The first feature or dummy feature 108a is then removed from the first region 104 of the workpiece 102, as shown in FIGS. 2 and 3. A masking material 112 is formed over the features 108a and 108b and the insulating material 110, as shown in FIG. 2. The masking material 112 may comprise a layer of photosensitive material such as a photoresist, for example. The masking material 112 may also include a hard mask comprising an oxide, nitride, or oxynitride, for example, not shown. The masking material 112 is patterned using lithography, and the masking material 112 is removed from over the first region 104 of the workpiece 102, as shown in FIG. 2.

Next, an etch process 114 is used to remove the first feature 108a from the first region 104, as shown in FIG. 2, leaving the structure shown in FIG. 3. The selection of the chemistry of the etch process 114 may vary depending on the type of insulating material 110 and conductive material 108a used, for example. In some embodiments, the etch process 114 preferably comprises a wet etch process, for example. In other embodiments, the etch process 114 preferably comprises a plasma etch process, a reactive ion etch (RIE) process, $CF_4$, $BCl_3$, a bromine-containing gas, a chlorine-containing gas, a fluorine-containing gas, or combinations thereof, as examples. In some embodiments, the etch process 114 preferably comprises 25% $CH_3COOH$, 25% $H_2O_2$, and 50% dionized (DI) water; 20% HF, 40% $HNO_3$ and 40% DI water; 1N solutions of NaOH in a heated solution; or ethylenediamine tetraacetic acid (EDTA) and $H_2O_2$, for example. Alternatively, other types of etch processes 114 or combinations of etch processes may be used. After the etch process 114, the first pattern 109a is then left exposed and unfilled in the first region 104, as can be seen in FIG. 3.

Figure 4:
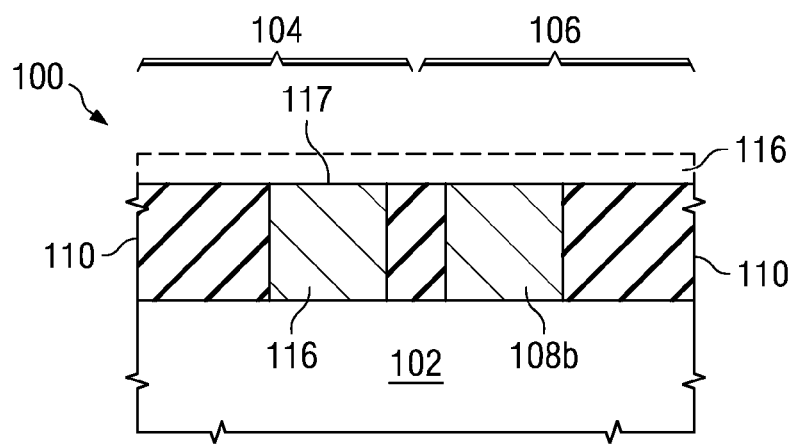

The first pattern 109a is then filled with an insulating material 116, as shown in FIG. 4. The insulating material 116 is also referred to herein as a second insulating material 116. The insulating material 116 may comprise the same material as the first insulating material 110, or the insulating material 116 may comprise a different material than the first insulating material 110, for example. The insulating material 116 preferably comprises spin-on glass (SOG), a low-k dielectric material having a dielectric constant of about 3.9 or less, an oxide material, a nitride material, or combinations or multiple layers thereof, in some embodiments, as examples, although alternatively, the insulating material 116 may comprise other dielectric materials. The insulating material 116 may comprise an organic or inorganic material, for example.

The second insulating material 116 may be deposited to just fill the first pattern 109a, as shown. Alternatively, the insulating material 116 may overfill the first pattern 109a, as shown in phantom in FIG. 4, and a second CMP process (not shown) may be used to remove any excess insulating material 116 from over and above the top surface of the first insulating material 110, for example. After the second CMP process, or after the second insulating material 116 is formed within the patterns 109a of the first insulating material 110, the top surface 117 is preferably substantially co-planar with the top surface of the first insulating material 110, as shown.

Processing of the semiconductor device 110 is then continued to complete the fabrication of the semiconductor device 110. For example, additional material layers and metallization layers may be formed and patterned over the insulating material layer 110, not shown. Individual die are then singulated and packaged, for example, also not shown.

The refilled first patterns 109a advantageously comprise a plurality of dummy features 116 comprising the second insulating material 116. Because the dummy features 116 are filled with an insulating material 116, the dummy features 116 advantageously do not electrically affect the functioning conductive features 108b in the second region 106 of the workpiece 102. The dummy features 108a comprising the conductive material 108a are present during the CMP process 111 for forming the features 108a and 108b, which improves the results and planarization of the CMP process 111, in accordance with embodiments of the present invention.

In some embodiments, the dummy or first features 108a and 116 in the first region 104 comprise substantially the same size as the plurality of conductive features or second features 108b in the second region 106, for example. In other embodiments, the dummy or first features 108a and 116 in the first region 104 comprise substantially the same shape as the plurality of conductive features or second features 108b in the second region 106, as another example. In other embodiments, the dummy or first features 108a and 116 in the first region 104 preferably comprise substantially the same shape and size as the plurality of conductive features or second features 108b in the second region 106, as yet another example. In yet other embodiments, the dummy or first features 108a and 116 in the first region 104 comprise different shapes and/or sizes than the functioning plurality of conductive features or second features 108b in the second region 106.

In the embodiment shown in FIGS. 1 through 4, the dummy features 108a and 116 and the second features 108b are formed using a single damascene process. Embodiments of the present invention may also be implemented in dual damascene processes and multiple layer damascene processes and structures.

Figure 5:
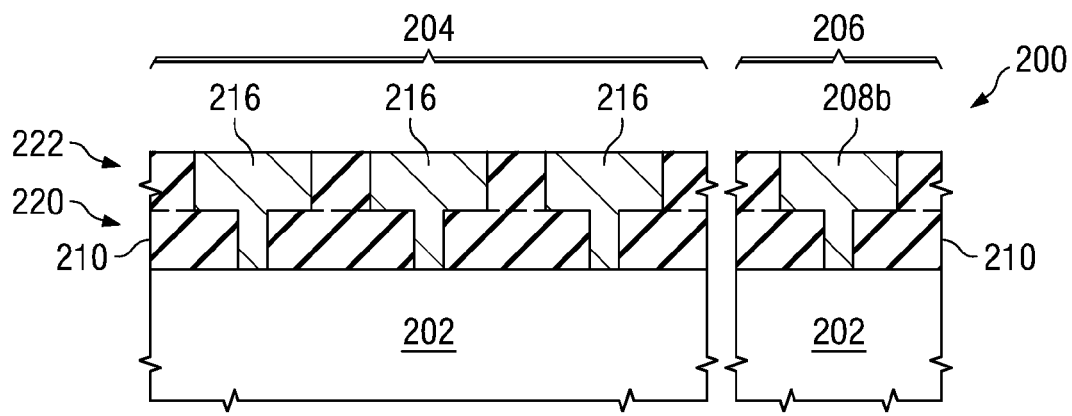
FIG. 5 shows a cross-sectional view of a semiconductor device in accordance with a preferred embodiment of the present invention wherein the first features and the second features comprise features formed in a dual damascene process.
Figure 6:
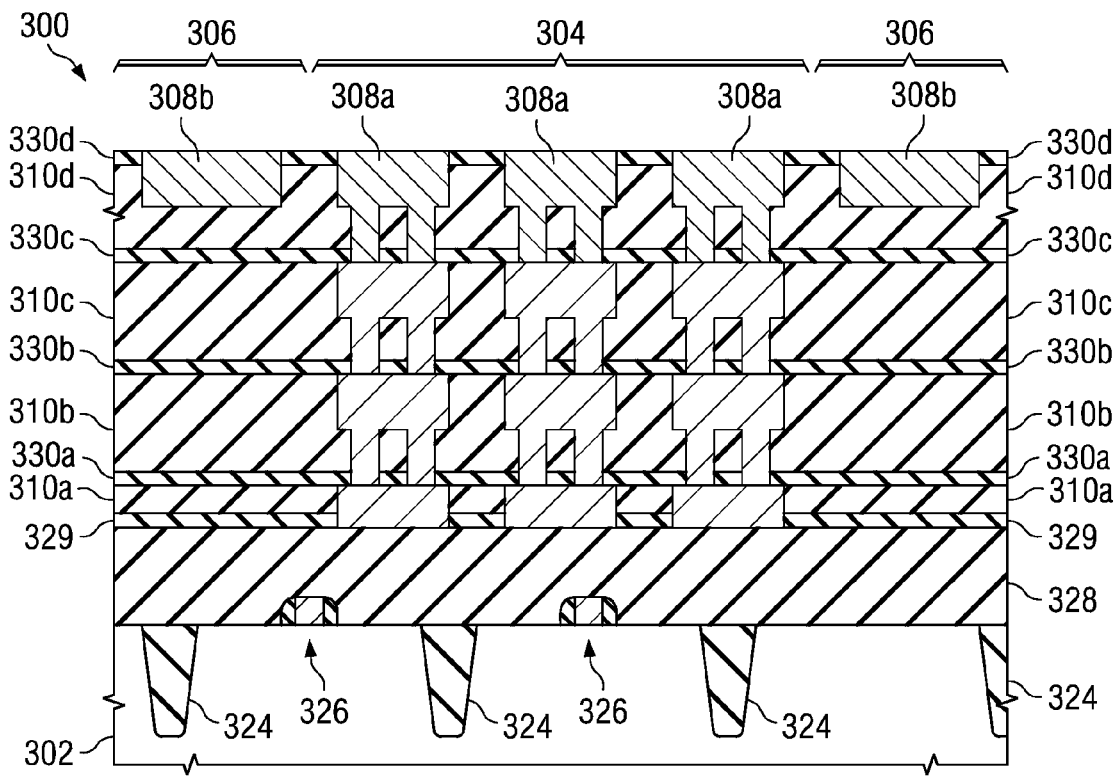
FIGS. 6 through 9 show cross-sectional views of a semiconductor device in accordance with another preferred embodiment of the present invention, wherein the first features and the second features comprise a plurality of features formed in multiple layers of insulating material.

FIG. 5 shows a cross-sectional view of a semiconductor device 200 in accordance with another preferred embodiment of the present invention wherein the first conductive features comprise features formed in a dual damascene process. Like numerals are used for the various elements that were described in FIGS. 1 through 4. To avoid repetition, each reference number shown in FIG. 5 is not described again in detail herein. Rather, similar materials x02, x04, x06, x08, etc . . . are preferably used to describe the various material layers shown as were used to describe FIGS. 1 through 4, where x=1 in FIGS. 1 through 4 and x=2 in FIG. 5. As an example, the preferred and alternative materials and dimensions described for the conductive material 108a and 108b and the insulating material 116 in the description for FIGS. 1 through 4 are preferably also used for conductive material 208b and the insulating material 216 shown in FIG. 5.

In this embodiment, the first insulating material 210 is preferably patterned with a pattern for vias in a via level 220 of the first insulating material 210. The first insulating material 210 is also patterned with a pattern for conductive lines in a conductive line level 222 of the first insulating material 210, as shown. Two lithography masks and lithography processes may be used to form the patterns in the first insulating material 210 for the features 216 and 208b, for example.

The patterns in the first region 204 and the second region 206 are simultaneously filled with a conductive material 208b (patterns in the first region 204 are also initially filled with the conductive material as shown in FIGS. 1 and 2; not shown in FIG. 5). A CMP process such as CMP process 111 shown in FIG. 1 is used to remove excess conductive material from over the first insulating material 210. The conductive material is then removed from the patterns in the first region 204, as shown and described for the embodiment shown in FIG. 3. The exposed, unfilled patterns in the first region 204 are then re-filled with a second insulating material, forming the dummy features 216 in the first region 204, as shown in FIG. 5.

FIGS. 6 through 9 show cross-sectional views of a semiconductor device 300 in accordance with yet another preferred embodiment of the present invention, wherein the first conductive features 308a comprise a plurality of features formed in multiple layers of insulating material. A plurality of damascene processes is used to form the first features 308a and the second features 308b in this embodiment. In particular, a plurality of dual damascene processes is used to form the first features 308a and the second features 308b in this embodiment, for example. Again, like numerals are used for the various elements that were used to describe the previous figures, and to avoid repetition, each reference number shown in FIGS. 6 through 9 is not described again in detail herein.

In this embodiment, two second regions 306 are shown having second features 308b comprising functioning circuitry. Dummy features 308a formed in the first region 304 improve the CMP process used to form the second features 308b.

Before forming the insulating materials 310a, 310b, 310c, and 310d, active areas may be formed in and over the workpiece 302, as shown. Isolation regions 324 may be formed in the workpiece 302, the isolation regions 324 comprising shallow trench isolation (STI) regions, deep trench (DT) isolation regions, field oxide isolation regions, or other insulating regions, as examples. A gate dielectric material may be deposited over the workpiece 302 and the isolation regions 324, and a gate material may be deposited over the gate dielectric material. The gate and gate dielectric material may be patterned, and sidewall spacers may be formed over the sidewalls of the gate and gate dielectric material to form transistors 326 over the workpiece 302, as shown. The workpiece 302 may be implanted with dopants to form source and drain regions of the transistors 326, for example.

An insulating material layer 328 may be formed over the transistors 326, and an etch stop layer 329 may be formed over the insulating material layer 328. Several first insulating material layers 310a, 310b, 310c, and 310d may be formed over the workpiece 302, as shown. The first insulating material layers 310a, 310b, 310c, and 310d may be separated by an adjacent first insulating material layer 310a, 310b, 310c, and 310d by an etch stop layer 330a, 330b, 330c, and 330d, as shown. An etch stop layer 330a, 330b, 330c, and 330d may be disposed over each first insulating material layer 310a, 310b, 310c, and 310d, for example. The etch stop layers 330a, 330b, 330c, and 330d assist in the CMP processes (not shown; see CMP process 111 shown in FIG. 1) and protect the first insulating material layers 310a, 310b, 310c, and 310d during the CMP processes 111, for example.

In the embodiment shown in FIGS. 6 through 9, each first feature 308a formed in the first insulating material layer 310a, 310b, 310c, and 310d comprises a lower via portion and an upper conductive line portion. The vias formed in the lower portion of each first insulating material layer 310a, 310b, 310c, and 310d preferably provide a vertical connection for all of the conductive lines formed in the upper portion of each first insulating material layers 310a, 310b, 310c, and 310d, as shown. Forming patterns in the first insulating material layers 310a, 310b, 310c, and 310d comprises forming a first pattern that is vertically connected within each of the plurality of first insulating material layers 310a, 310b, 310c, and 310d, e.g., by the via portions of the patterns.

Figure 7:
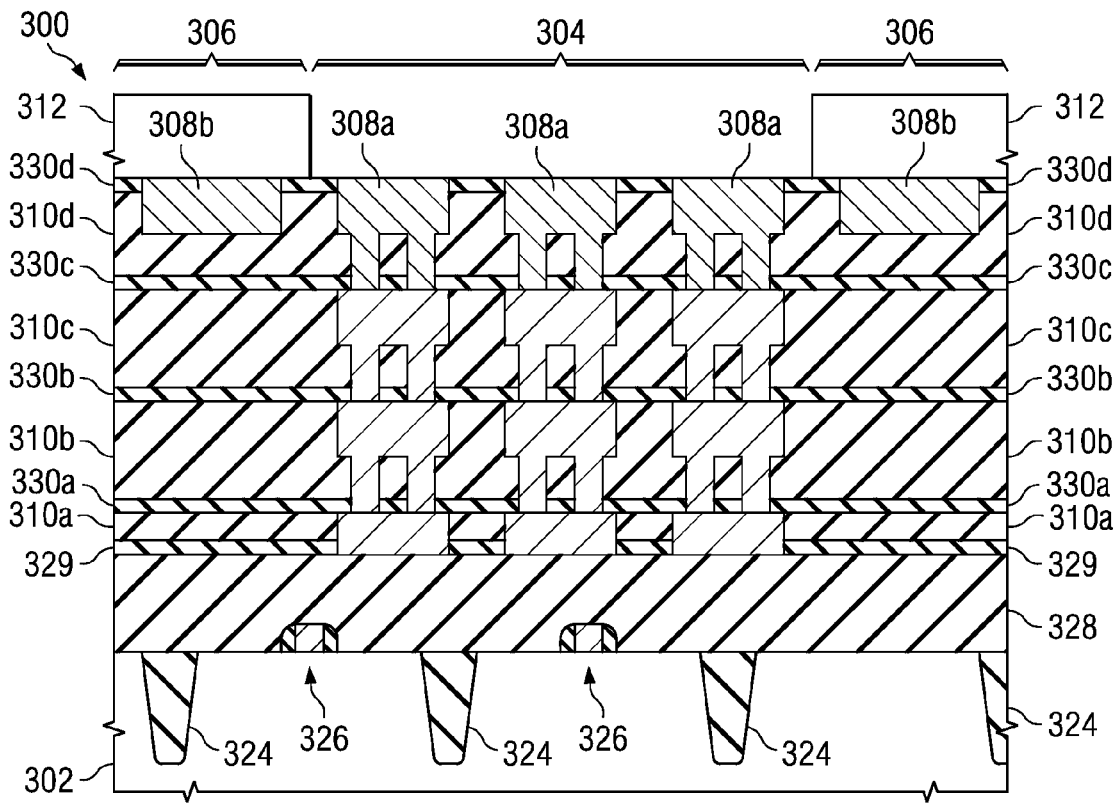

Then, the second region 306 is masked using the masking material 312 as shown in FIG. 7. An etch process 314 may then be used to simultaneously remove all of the first features 308a in the first region 304 in each first insulating material layer 310a, 310b, 310c, and 310d, as shown in FIG. 8, leaving unfilled patterns as shown at 332, due to the vertical connection of the first features 308a in the plurality of first insulating material layers 310a, 310b, 310c, and 310d to first features 308a in adjacent first insulating material layers 310a, 310b, 310c, and 310d.

In the embodiment shown in FIGS. 6 through 9, forming the first insulating material comprises forming a plurality of insulating material layers 310a, 310b, 310c, and 310d. Patterning the first insulating material with the first pattern for the plurality of first features 308a in the first region and the second pattern for the plurality of second features 308b in the second region comprises forming the first pattern and the second pattern in each of the plurality of insulating material layers 310a, 310b, 310c, and 310d of the first insulating material.

Figure 8:
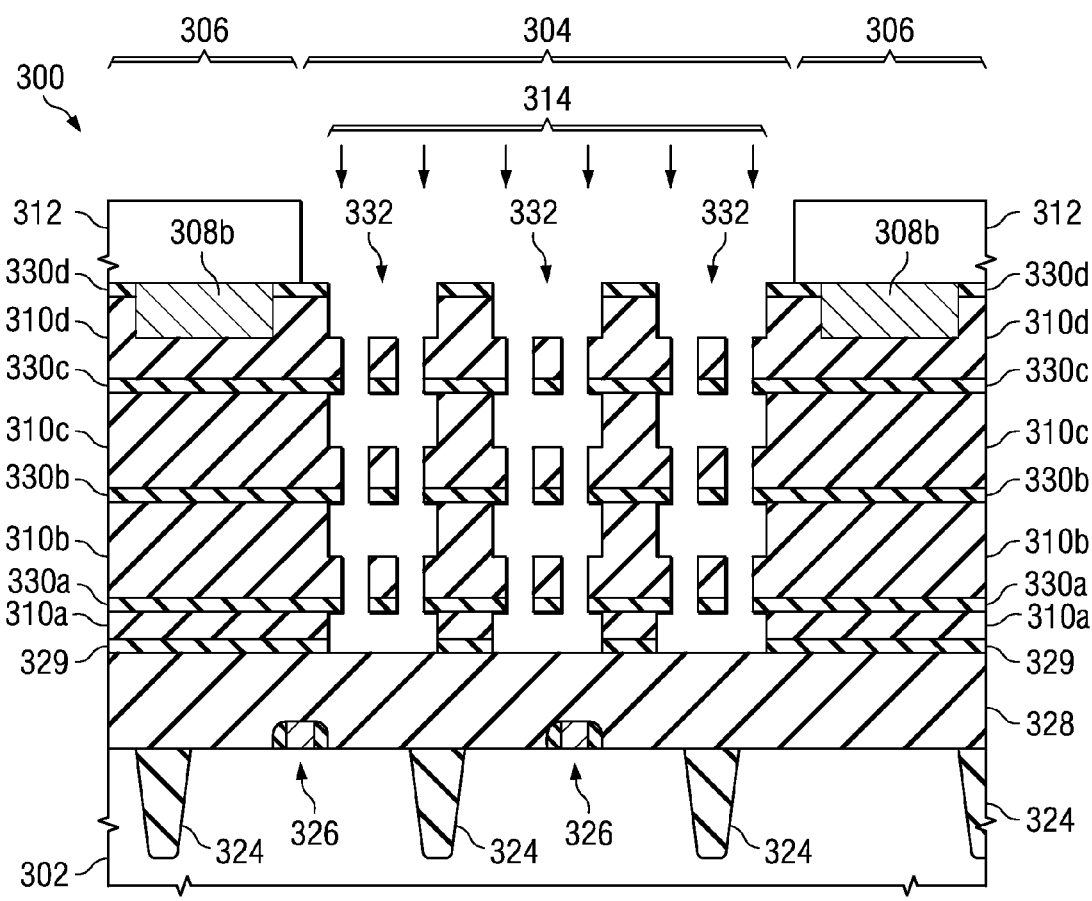
Figure 9:
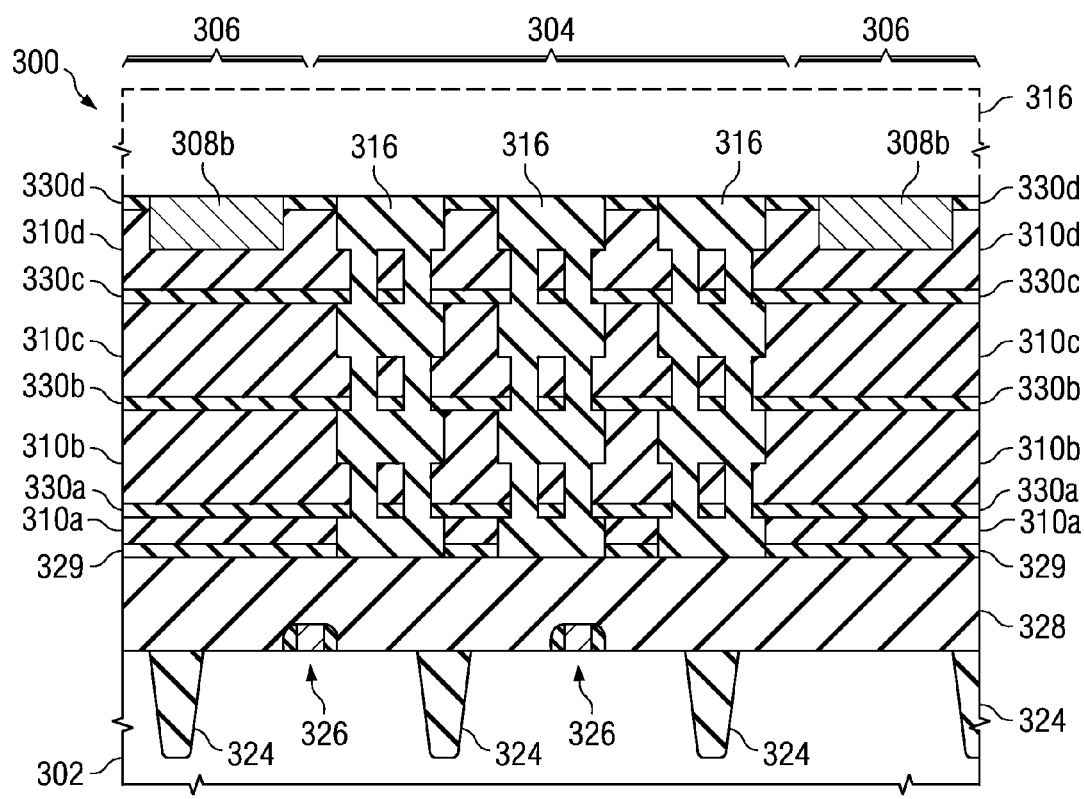

Thus, in the embodiment shown in FIGS. 6 through 9, the conductive material is simultaneously removed from within the first pattern for the plurality of first features 308a from all first insulating material layers 310a, 310b, 310c, and 310d after the completion of all of the plurality of damascene processes used to form the first features 308a and second features 308b, as shown in FIG. 8. All of the first patterns, e.g., in each of the first insulating material layers 310a, 310b, 310c, and 310d, are then preferably simultaneously filled with the second insulating material 316 to form the dummy features 316 comprising the second insulating material 316, as shown in FIG. 9. Because the via portions of the patterns of the first features provide vertical connection between the first insulating material layers 310a, 310b, 310c, and 310d, advantageously, all of the patterns in the first region 304 may be removed and then refilled with the second insulating material 316 at once, in accordance with this embodiment of the present invention.

Note that functioning second features 308b may also be formed in first insulating material layers 310a, 310b, and 310c, rather than only in first insulating material layer 310d, as shown.

Figure 10:
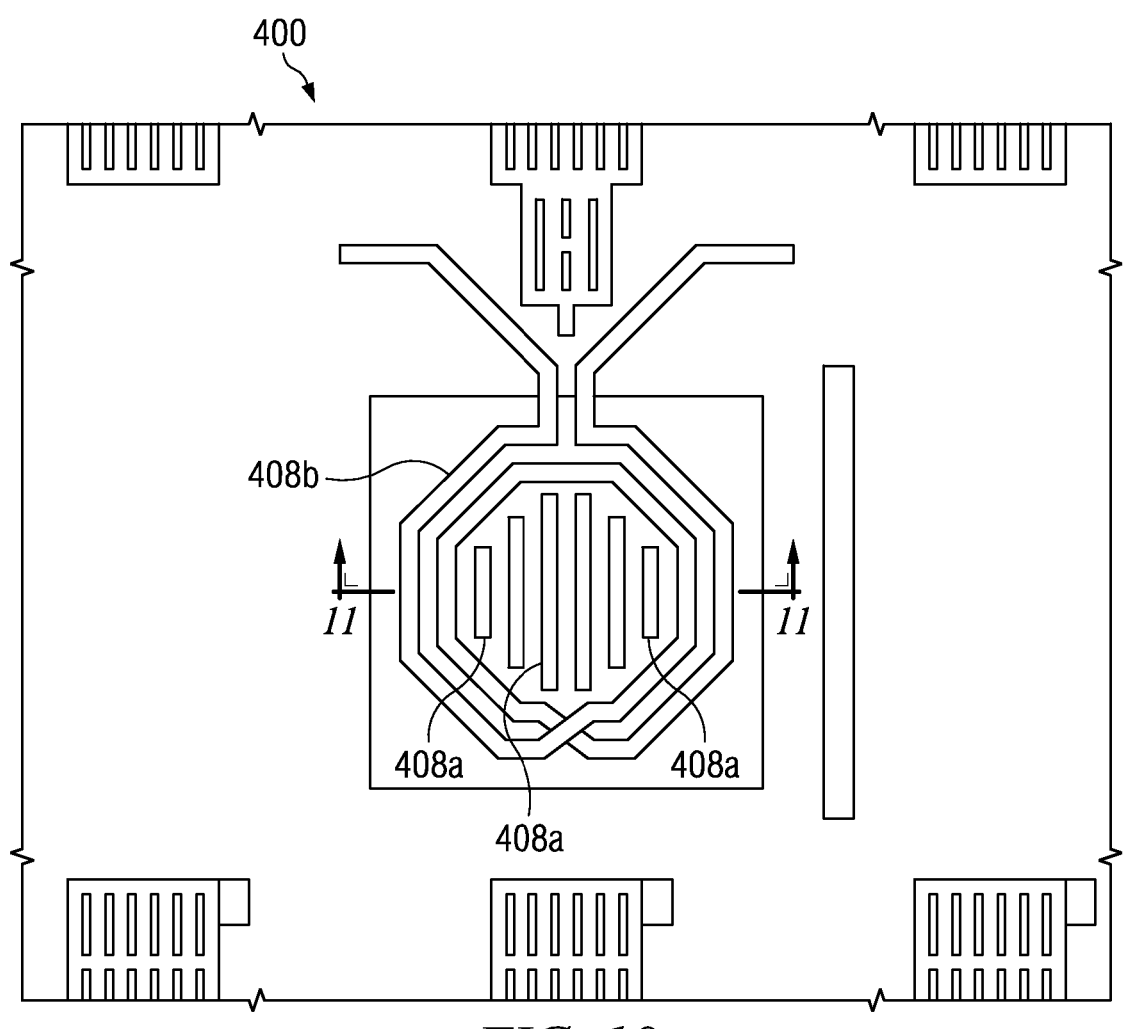
FIG. 10 shows a top view of a semiconductor device wherein first conductive features comprise dummy features formed proximate a passive device comprising a plurality of second conductive features.
Figure 11:
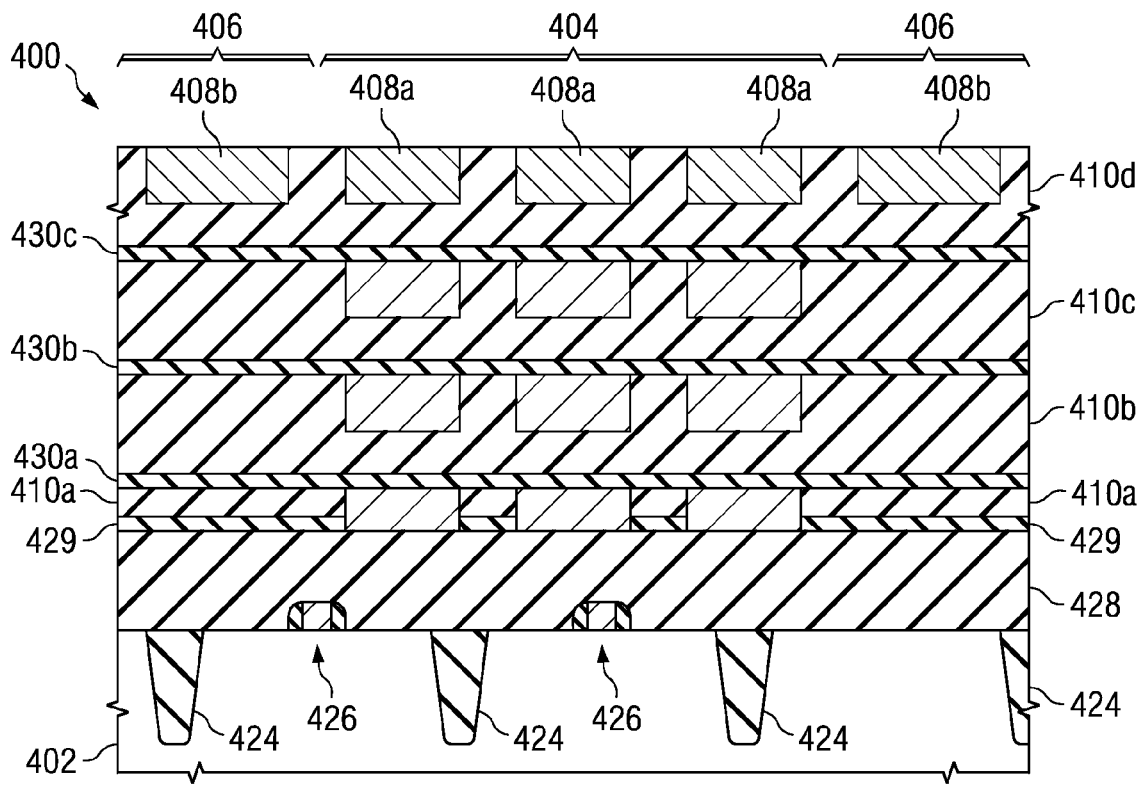
FIGS. 11 and 12 show cross-sectional views of the semiconductor device shown in FIG. 10 at various stages of manufacturing.
Figure 12:
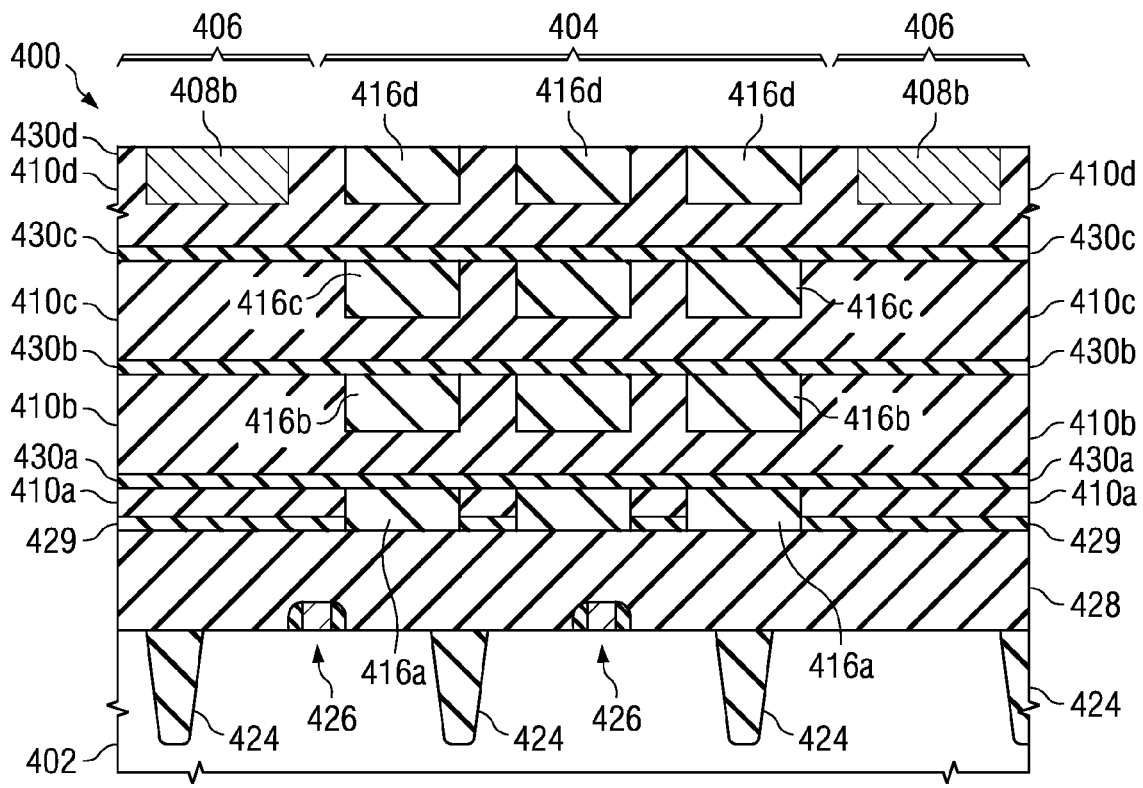

FIG. 10 shows a top view of a semiconductor device 400 wherein the first conductive features 408a comprise dummy features formed proximate a passive device comprising a plurality of second conductive features 408b. FIGS. 11 and 12 show cross-sectional views of the semiconductor device 400 shown in FIG. 10 at various stages of manufacturing. Again, like numerals are used to describe the various elements shown in FIGS. 10 through 12 as were used to describe the previous figures, and to avoid repetition, each reference number shown in FIGS. 10 through 12 is not described again in detail herein.

In the embodiment shown in FIGS. 10 through 12, a plurality of damascene processes is used to form the first features 408a and the second features 408b. In particular, a plurality of single damascene processes is used to form the first features 408a and the second features 408b, for example.

Forming the first insulating material in this embodiment comprises forming a plurality of insulating material layers 410a, 410b, 410c, and 410d. Each insulating material layer 410a, 410b, 410c, and 410d may comprise a bilayer of two insulating material layers, for example. Patterning the first insulating material with the first pattern for the plurality of first features in the first region and the second pattern for the plurality of second features in the second region preferably comprises forming the first pattern and the second pattern in at least every other of the plurality of insulating material layers of the first insulating material, for example, as shown. The pattern in the first region 404 may not be vertically connected; e.g., via portions may not be formed in alternating insulating material layers.

In the embodiment shown in FIGS. 10 through 12, the second features 408b comprise an inductor. Some logic devices may include large passive devices such as the inductor shown in FIG. 10 in a top view, for example, although inductors may also be used in other applications. The inductor formed from the second features 408b may comprise a relatively large shaped feature without any electric interruption, e.g., a continuous line of conductive material shaped in a circular ring. The dummy or first features 408a are needed for improved planarization, process integration, and stabilization, although if left in the structure, the dummy or first features 408a may cause performance degradation or noise. If the first features 408a were to be left remaining in the first region 404, as shown in FIG. 11 in a cross-sectional view, for example, the conductive first features 408a may cause parasitic capacitance which would deleteriously affect the performance of the inductor, for example.

Therefore, in accordance with embodiments of the present invention, the conductive first features 408a are preferably removed and are replaced with insulating material 416a, 416b, 416c, and 416d, as shown in FIG. 12. The insulating material 416a, 416b, 416c, and 416d within the patterns in the first insulating material layers 410a, 410b, 410c, and 410d comprises insulative dummy features 416a, 416b, 416c, and 416d.

Note that in this embodiment, the conductive material 408a is preferably removed from within the first pattern for the plurality of first features 408a after each of the plurality of damascene processes used to form the first features 408a and second features 408b within the first insulating material layers 410a, 410b, 410c, and 410d. The first feature patterns are then refilled with insulating materials 416a, 416b, 416c, and 416d before the deposition of the next first insulating material layer 410b, 410c, and 410d.

Note that as in the previous embodiment, functioning second features 408b may also be formed in first insulating material layers 410a, 410b, and 410c, rather than only in first insulating material layer 410d, as shown.

Note also that in the embodiment shown in FIGS. 10 through 12, the patterns for the first features or dummy features 408a may include via portions as in the embodiment shown in FIGS. 6 through 9, to provide vertical connection through each of the first insulating material layers 410a, 410b, 410c, 410d, so that the conductive material 408a may be removed all at once in the first region, and also so that the second insulating material may be filled within the patterns in the first region 404 simultaneously in one deposition step.

Embodiments of the present invention include semiconductor devices 100, 200, 300, and 400 that include dummy features 116, 216, 316, 416a, 416b, 416c, and 416d comprising an insulating material that are formed proximate functioning conductive features, e.g., second features 108b, 208b, 308b, and 408b. Embodiments of the present invention also include methods of fabricating the semiconductor devices 100, 200, 300, and 400 described herein, for example.

Advantages of embodiments of the invention include providing novel structures and methods for providing dummy conductive features 108a, 208a, 308a, and 408a that are present during a CMP process and improve the planarization characteristics of the CMP process. The dummy conductive features are later removed and replaced with an insulating material, forming dummy features 116, 216, 316, 416a, 416b, 416c, and 416d. Because the dummy features 116, 216, 316, 416a, 416b, 416c, and 416d are not conductive, they advantageously do not negatively affect the functioning features 108b, 208b, 308b, and 408b proximate the dummy conductive features 116, 216, 316, 416a, 416b, 416c, and 416d.

Thus, embodiments of the present invention result in reduced noise and parasitic capacitance, and also result in other improved electrical parameters, for example. The insulating material 116, 216, 316, 416a, 416b, 416c, and 416d of the dummy features 116, 216, 316, 416a, 416b, 416c, and 416d also provides improved insulating properties in the first region 104, 204, 304, and 404, for example.

Embodiments of the present invention are easily implementable in existing manufacturing process flows, with few additional processing steps being required for implementation of the invention, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a semiconductor wafer;
   forming a first insulating material over the semiconductor wafer;
   forming a plurality of first features and a plurality of second features in the first insulating material;
   removing the plurality of first features, leaving an unfilled pattern in the first insulating material; and
   filling the unfilled pattern in the first insulating material with a second insulating material.

2. The method according to claim 1, wherein forming the plurality of first features and the plurality of second features comprises at least one damascene process.

3. The method according to claim 1, wherein removing the plurality of first features comprises depositing a layer of photosensitive material over the first insulating material, the plurality of first features, and the plurality of second features, removing the layer of photosensitive material from over the plurality of first features, etching away the plurality of first features, and removing the layer of photosensitive material.

4. The method according to claim 1, wherein forming the plurality of first features and the plurality of second features comprises a single damascene process.

5. The method according to claim 1, wherein forming the plurality of first features and the plurality of second features comprises a dual damascene process.

6. The method according to claim 1, wherein forming the plurality of first features and the plurality of second features comprises forming a conductive material, a semiconductive material, or combinations thereof.

7. A method of manufacturing a semiconductor device, the method comprising:
   providing a workpiece;
   forming a first insulating material over the workpiece;
   patterning the first insulating material with a first pattern for a plurality of first features and a second pattern for a plurality of second features proximate the first pattern for the plurality of first features;
   filling the first pattern and the second pattern in the first insulating material with a conductive material;
   removing the conductive material from within the first pattern for the plurality of first features, leaving the conductive material in the second pattern for the plurality of second features; and
   filling the first pattern for the plurality of first features with a second insulating material.

8. The method according to claim 7, wherein patterning the first insulating material with a first pattern for a plurality of first features and a second pattern for a plurality of second features proximate the first pattern for the plurality of first features, filling the first pattern and the second pattern in the first insulating material with a conductive material, and removing the conductive material from within the first pattern for the plurality of first features, leaving the conductive material in the second pattern for the plurality of second features comprises a plurality of damascene processes.

9. The method according to claim 8, further comprising removing the conductive material from within the first pattern for the plurality of first features after each of the plurality of damascene processes.

10. The method according to claim 8, wherein forming the first insulating material comprises forming a plurality of first insulating material layers, wherein patterning the first insulating material with the first pattern comprises forming a first pattern that is vertically connected within each of the plurality of first insulating material layers, further comprising removing the conductive material from within the first pattern for the plurality of first features after the completion of all of the plurality of damascene processes.

11. The method according to claim 7, wherein removing the conductive material comprises using a wet etch process.

12. The method according to claim 7, wherein filling the first pattern for the plurality of first features with the second insulating material comprises filling the first pattern for the plurality of first features with spin-on glass (SOG), a dielectric material having a dielectric constant of about 3.9 or less, an oxide material, a nitride material, or combinations or multiple layers thereof.

13. The method according to claim 7, wherein filling the first pattern for the plurality of first features with the second insulating material comprises filling the first pattern for the plurality of first features with the same material as the first insulating material.

14. A method of manufacturing a semiconductor device, the method comprising:
   providing a workpiece, the workpiece comprising a first region and a second region proximate the first region;
   forming a first insulating material over the workpiece, the first insulating material having a top surface;
   patterning the first insulating material with a first pattern for a plurality of first features in the first region and a second pattern for a plurality of second features in the second region;
   filling the first pattern and the second pattern in the first insulating material with a conductive material, forming a plurality of first features in the first region and a plurality of second features in the second region within the first insulating material;
   removing excess conductive material from over the top surface of the first insulating material using a chemical-mechanical polish (CMP) process;
   removing the plurality of first features from the first region; and
   filling the first pattern for the plurality of first features in the first region with a second insulating material.

15. The method according to claim 14, wherein forming the first insulating material comprises forming a plurality of insulating material layers, and wherein patterning the first insulating material with the first pattern for the plurality of first features in the first region and the second pattern for the plurality of second features in the second region comprise forming the first pattern and the second pattern in at least every other of the plurality of insulating material layers of the first insulating material.

16. The method according to claim 14, wherein forming the first insulating material comprises forming a plurality of insulating material layers, and wherein patterning the first insulating material with the first pattern for the plurality of first features in the first region and the second pattern for the plurality of second features in the second region comprise forming the first pattern and the second pattern in each of the plurality of insulating material layers of the first insulating material.

17. The method according to claim 14, wherein the presence of the plurality of first features improves planarization of the CMP process.

18. The method according to claim 14, wherein the CMP process comprises a first CMP process, further comprising removing excess second insulating material from over the top surface of the first insulating material using a second CMP process, after filling the first pattern for the plurality of first features in the first region with the second insulating material.

19. The method according to claim 14, wherein removing the plurality of first features comprises using an etch process comprising a wet etch process; a plasma etch process; a reactive ion etch (RIE) process; $CF_4$; $BCl_3$; a bromine-containing gas; a chlorine-containing gas; a fluorine-containing gas; 25% $CH_3COOH$, 25% $H_2O_2$, and 50% dionized (DI) water; 20% HF, 40% $HNO_3$, and 40% DI water; 1N solutions of NaOH in a heated solution; ethylenediamine tetraacetic acid (EDTA) and $H_2O_2$, or combinations thereof.

20. A semiconductor device, comprising:
 a workpiece, the workpiece comprising a first region and a second region proximate the first region;
 a first insulating material disposed over the workpiece;
 a plurality of dummy features disposed in the first insulating material in the first region, the plurality of dummy features comprising a second insulating material; and
 a plurality of conductive features disposed in the first insulating material in the second region.

21. The semiconductor device according to claim 20, wherein the plurality of dummy features comprise substantially the same size as the plurality of conductive features.

22. The semiconductor device according to claim 20, wherein the plurality of dummy features comprise substantially the same shape as the plurality of conductive features.

23. The semiconductor device according to claim 20, wherein the plurality of conductive features comprises a passive component of the semiconductor device.

24. The semiconductor device according to claim 20, wherein the plurality of conductive features comprises at least a portion of an inductor, a capacitor, an antenna, a conductive line, or a conductive via.

25. The semiconductor device according to claim 20, wherein the second insulating material comprises a different material than the first insulating material.

* * * * *